United States Patent
Sel et al.

(10) Patent No.: US 7,645,644 B2
(45) Date of Patent: Jan. 12, 2010

(54) DATA LINE LAYOUT IN SEMICONDUCTOR MEMORY DEVICE AND METHOD OF FORMING THE SAME

(75) Inventors: Jong-Sun Sel, Yongin-si (KR); Jung-Dal Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 55 days.

(21) Appl. No.: 12/113,994

(22) Filed: May 2, 2008

(65) Prior Publication Data
US 2008/0206932 A1 Aug. 28, 2008

Related U.S. Application Data

(62) Division of application No. 11/444,355, filed on Jun. 1, 2006, now Pat. No. 7,385,834.

(30) Foreign Application Priority Data

Jun. 1, 2005 (KR) ............................... 2005-46897

(51) Int. Cl.
*H01L 21/82* (2006.01)
(52) U.S. Cl. ........................ 438/128; 438/129; 257/678; 257/E21.656; 711/117; 711/123; 365/189.14; 365/189.011
(58) Field of Classification Search ................ 438/128, 438/129; 365/230.6, 189.14, 189.011, 189.15, 365/189.16, 189.17; 711/100, 117, 123, 711/154; 257/678, 698, E21.656
See application file for complete search history.

(56) References Cited

U.S. PATENT DOCUMENTS
2003/0227063 A1 12/2003 Sel et al.

FOREIGN PATENT DOCUMENTS

| JP | 60-109268 | 6/1985 |
|---|---|---|
| JP | 02-123596 | 5/1990 |
| JP | 04-346470 | 12/1992 |
| JP | 2000-076880 | 3/2000 |
| KR | 1020000050309 A | 8/2000 |
| KR | 1020020056208 A | 7/2002 |
| KR | 1020030093787 A | 12/2003 |

*Primary Examiner*—Hsien-ming Lee
(74) *Attorney, Agent, or Firm*—Volentine & Whitt, PLLC (57) ABSTRACT

In one aspect, a semiconductor device is provided which includes a data block including M parallel and sequentially arranged data lines numbered {0, 1, 2, ... n, n+1, ..., m−1, m}, where M, n and m are positive integers, and where n<m, and M=m+1, and a first decoder region and a second decoder region respectively located on opposite sides of the data block. A first data line group among the M data lines extend to the first decoder region from the data block, and a second data line group among the M data lines extend to the second decoder region from the data block. The first data line group includes even numbered data lines among the data lines {0, 1, 2, ... n}, and odd numbered data lines among the data lines {n+1, ... m−1, m}, and the second data line group includes odd numbered data lines among the data lines {0, 1, 2, ... n}, and even numbered data lines among the data lines {n+1, ... m−1, m}.

7 Claims, 12 Drawing Sheets

Fig. 1

(PRIOR ART)

Fig. 2

(PRIOR ART)

DATA LINE LAYOUT IN SEMICONDUCTOR MEMORY DEVICE AND METHOD OF FORMING THE SAME

CROSS-REFERENCE TO RELATED APPLICATIONS

This is a divisional of application Ser. No. 11/444,355, filed Jun. 1, 2006, now U.S. Pat. No. 7,385,834, which is incorporated herein by reference in its entirety.

BACKGROUND OF THE INVENTION

1. Field of the Invention

The present invention generally relates to semiconductor devices, and more particularly, the present invention relates to a data line layout for signal transmission in a semiconductor memory device and to a method of forming the same.

2. Description of the Related Art

A semiconductor memory device generally includes a memory cell array region for storing data and a peripheral circuit region for accessing that memory cells and conducting various process operations. The memory cell array region generally includes a plurality of data blocks having intersecting word lines and bit lines. A decoder region is operatively interposed between the memory cell array region and the peripheral circuit region to transmit address and data signals there between. The decoder region is generally divided into a row decoder region for interfacing the word lines of the memory cell array region with the peripheral circuit region, and a column decoder region for interfacing the bit lines of the memory cell array region with the peripheral circuit region.

Figure 1:
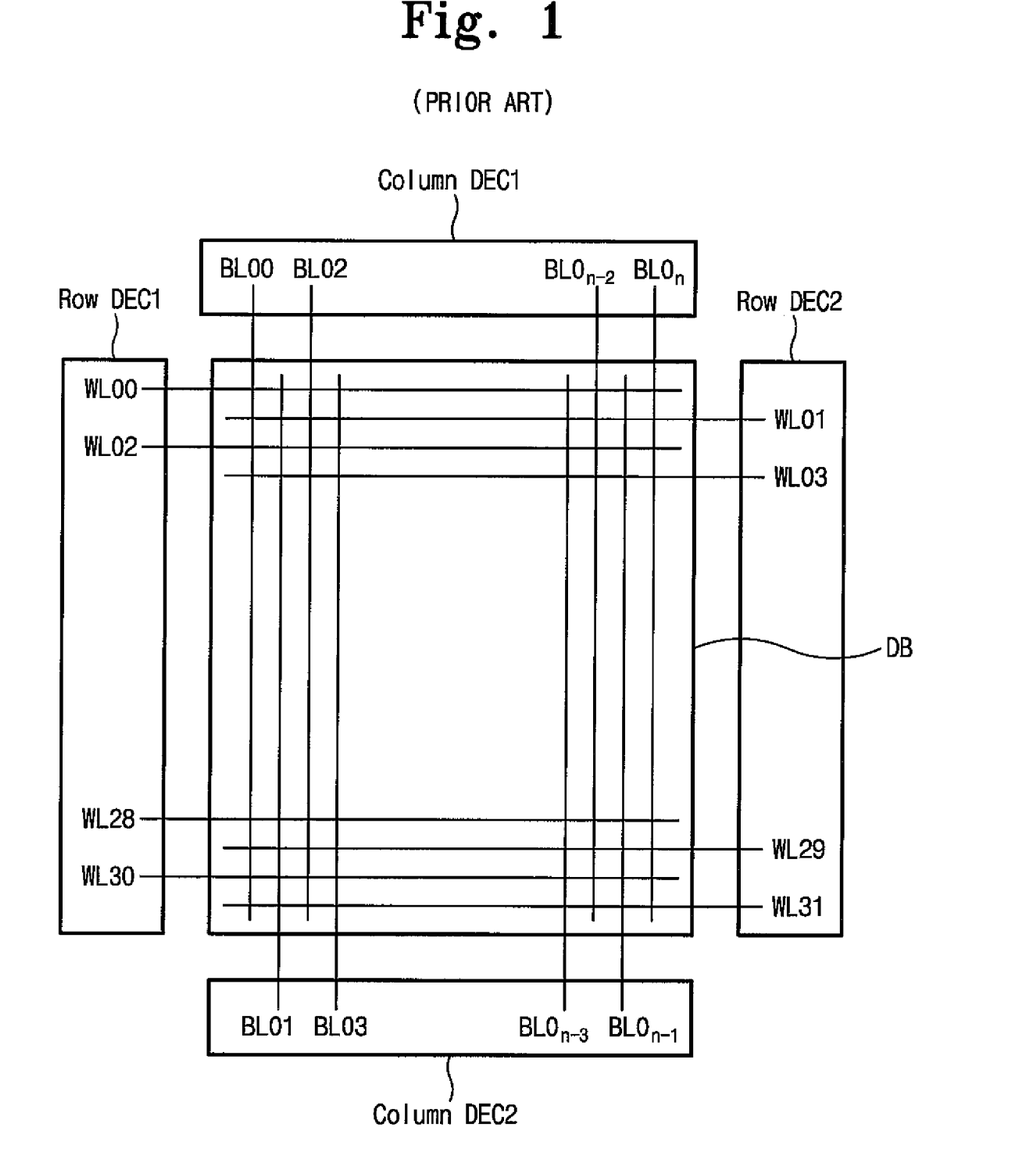
FIG. 1 is a plan view illustrating the layout of a conventional semiconductor memory device.

FIG. 1 is a plan view illustrating the layout of a conventional semiconductor memory device.

Referring to FIG. 1, the conventional semiconductor memory device of this example includes a data block DB located at intersections of a plurality of word lines WL<0:31> and a plurality of bit lines BL<0:n>. Also according to this example, the even numbered word lines WL extent to a first row decoder Row DEC1, and the odd numbered word lines WL extend to a second row decoder Row DEC2, where the first and second row decoders Row DEC1 and Row DEC2 are located on opposite sides of the data block DB. Likewise, the even numbered bit lines BL extent to a first column decoder Column DEC1, and the odd numbered bit lines BL extend to a second column decoder Column DEC2, where the first and second column decoders Column DEC1 and Column DEC2 are located on opposite sides of the data block DB.

In an alternative layout (not shown), a single row decoder is provided on one side of the data block DB and coupled to all the word lines WL, and a single column decoder is provided on one side of the data block DB and couple to all the bit lines. However, by providing two row decoders and two column decoders on opposite sides of the data block DB as in FIG. 1, the pitch between the bit lines and the pitch between the word lines can be more easily narrowed.

Figure 2:
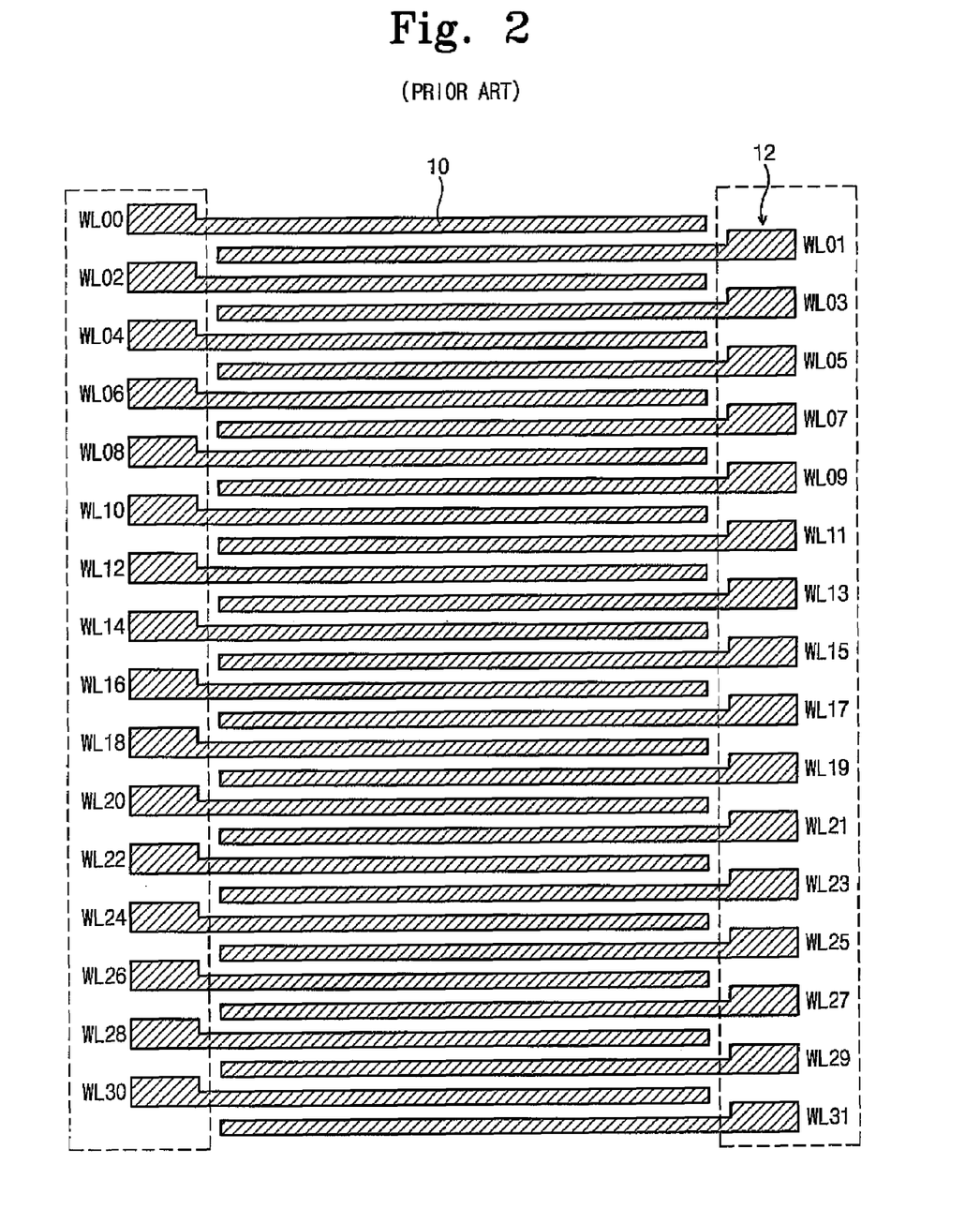
FIG. 2 is a plan view illustrating a data line layout of a conventional semiconductor memory device.

FIG. 2 is a plan view illustrating the word line layout of a data block of a conventional semiconductor memory device. In this example, each data block of the memory device includes thirty-two word lines WL<0:31>.

As illustrated in FIG. 2, odd-number word lines among word lines WL00-WL31 extend to a right decoder region, and even-number word lines among word lines WL00-31 extend to a left decoder region. Each word line includes a pad extension portion 12 which extend in a given direction for connecting to a peripheral device through wiring. Since the even-number word lines and the odd-number word lines are alternately connected to the left side decoder region and the right side decoder region, a relatively large interval between the pad extension portions 12 can be obtained. However, when a line width of the word line is reduced to less than the limitation value that is defined through the photo-etching process, the interval 10 between the adjacent pad extension portions 12 is reduced, which can make it difficult maintain sufficient spacing to allow for formation of contact patterns on the pad extension portions 12.

SUMMARY OF THE INVENTION

According to an aspect of the present invention, a semiconductor device is provided which includes a data block including M parallel and sequentially arranged data lines numbered {0, 1, 2, ... n, n+1, ..., m−1, m}, where M, n and m are positive integers, and where n<m, and M=m+1, and a first decoder region and a second decoder region respectively located on opposite sides of the data block. A first data line group among the M data lines extend to the first decoder region from the data block, and a second data line group among the M data lines extend to the second decoder region from the data block. The first data line group includes even numbered data lines among the data lines {0, 1, 2, ... n}, and odd numbered data lines among the data lines {n+1, ... m−1, m}, and the second data line group includes odd numbered data lines among the data lines {0, 1, 2, ... n}, and even numbered data lines among the data lines {n+1, ... m−1, m}.

According to another aspect of the present invention, a method of forming data lines is provide which includes defining a data block on a semiconductor substrate and first and second decoder regions on opposite sides of the data block, forming a plurality of parallel dummy patterns extended so as to cross over the data block from the first decoder region to the second decoder region, forming spacer patterns surrounding sidewalls of the plurality of dummy patterns, and separating each of the spacer pattern into two portions by patterning to define M parallel and sequentially arranged data lines numbered {0, 1, 2, ... n, n+, ..., m−1, m}, where M, n and m are positive integers, and where n<m, and M=m+1, A first data line group among the M data lines extend to the first decoder region from the data block, and a second data line group among the M data lines extend to the second decoder region from the data block. The first data line group includes even numbered data lines among the data lines {0, 1, 2, ... n}, and odd numbered data lines among the data lines {n+1, ... m−1, m}, and the second data line group includes odd numbered data lines among the data lines {0, 1, 2, ... n}, and even numbered data lines among the data lines {n+1, ... m−1, m}.

BRIEF DESCRIPTION OF THE DRAWINGS

The above and other aspects and features of embodiments of the present invention will become readily apparent from the detailed description that follows, with reference to the accompanying drawings, in which.

DETAILED DESCRIPTION OF PREFERRED EMBODIMENTS

Reference will now be made in detail to the preferred embodiments of the present invention, examples of which are illustrated in the accompanying drawings. However, the present invention is not limited to the embodiments illustrated herein after, and instead the embodiments presented herein to facilitate understanding of the scope and spirit of the present invention. In the drawings, the thickness of layers and regions are exaggerated for clarity. It will also be understood that when a layer is referred to as being on another layer or substrate, it can be directly on the other layer or substrate, or intervening layers may also be present. Like reference numerals refer to like or similar elements throughout the drawings.

Figure 3:
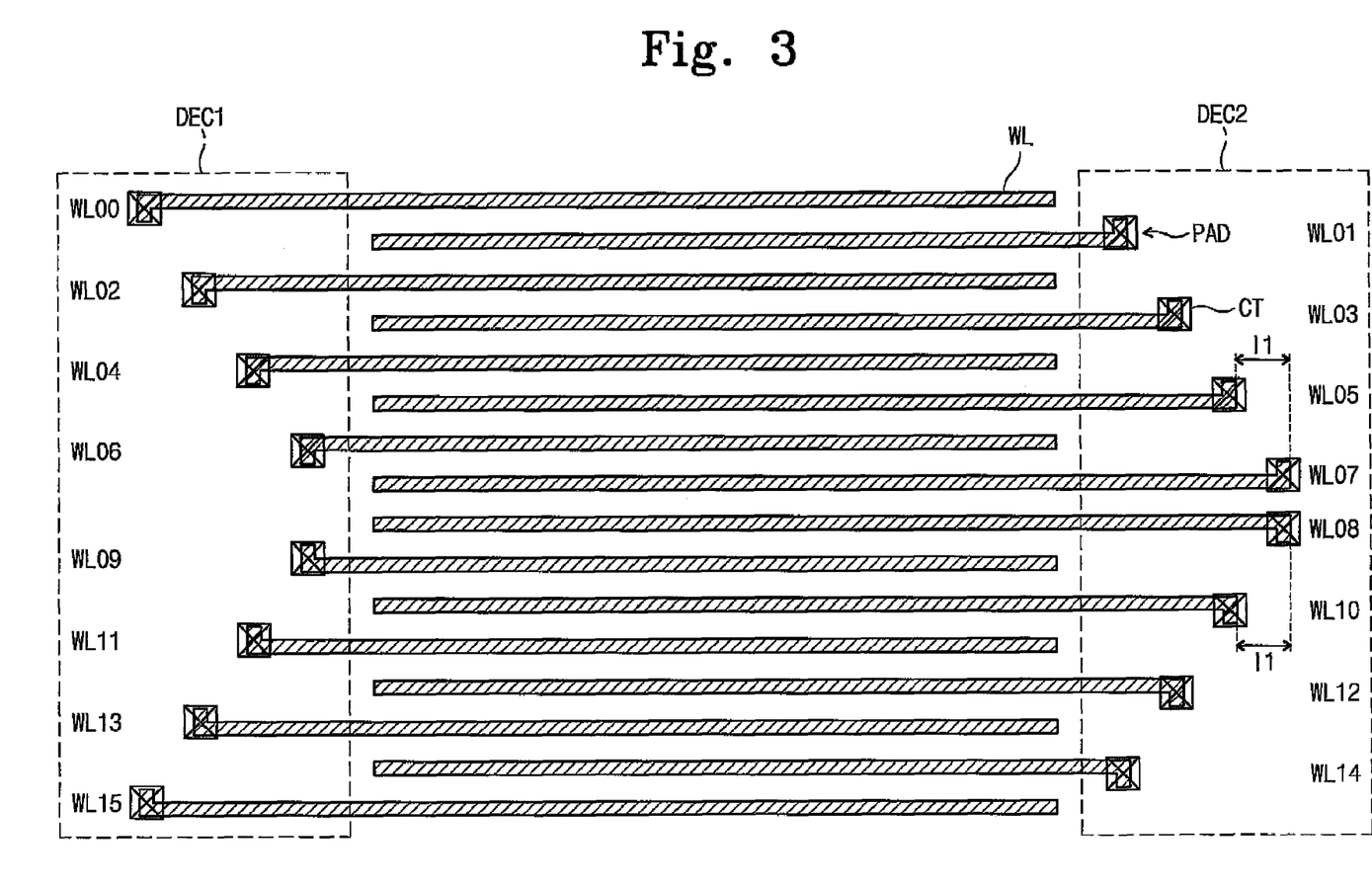
FIG. 3 is a plan view illustrating a data line layout of a semiconductor memory device according to a first embodiment of the present invention.

FIG. 3 is a plan view illustrating a data line layout of a semiconductor memory device according to a first embodiment of the present invention.

A memory cell array of the semiconductor memory device includes a plurality of data blocks, and the data block includes word lines which may number in multiples of eight. Referring to FIG. 3, each data block of the semiconductor memory device of this example includes M parallel word lines WL which are sequentially numbered {0, 1, . . . , m−1, m}, where M=m+1. In the particular 10 example of this embodiment, M=16 (i.e., m=15), and thus each data block includes sixteen word lines WL00-WL15. Preferably, the number M of word lines WL is a multiple of eight, such as 8, 16, 32, 64, and so on.

Also, as shown in FIG. 3, a first decoder region DEC1 and a second decoder region DEC2 are defined at opposite sides of the data block, respectively.

The word lines WL are divided into two groups, i.e., a first word line group and a second word line group. The first word line group extends to the first decoder region DEC1, and the second word line group extends to the second decoder region DEC2.

Referring to FIG. 3, the first word line group includes even numbered word lines among the word lines WL {0, 1, 2, . . . n}, and odd numbered word lines among the word lines WL {n+1, . . . m−1, m}, where n<m. Preferably n is an odd number, and also preferably m=2n+1. In the example of this embodiment, n=7. Thus, the first word line group includes the word lines WL00, WL02, WL04, WL06, WL09, WL11, WL13 and WL15.

The second word line group includes odd numbered word lines among the word lines WL {0, 1, 2, . . . n}, and even numbered word lines among the word lines WL {n+1, . . . m−1, m}. Again, in the example of this embodiment, n=7. Thus, the second word line group includes the word lines WL01, WL03, WL05, WL07, WL08, WL10, WL12 and WL14.

In the example of this embodiment as shown in FIG. 3, one end of each of the word lines WL includes a pad extension portion PAD on which a contact pattern CT is formed. That is, if the word lines WL are considered to extend in a first direction (e.g., left-to-right in FIG. 3), one end of the word lines WL includes pad extension portions extending an angle (e.g., up-and-down in FIG. 3) relative to the first direction.

Also in the example of this embodiment as shown in FIG. 3, the pad extension portions of the even number WL lines among the word lines WL {0, 1, 2, . . . , m−1, m} and the pad extension portions of the odd numbered word lines WL among the word lines WL {0, 1, 2, . . . m−1, m} extend in opposite directions. More particularly, relative to the plane view of FIG. 3, the pad extension portions of the even word lines WL00 . . . WL14 extend downwardly in the figure, whereas the pad extension portions of the odd word lines WL01 . . . WL15 extend upwardly in the figure. Thus, in the second decoder DEC2, the immediately adjacent $n^{th}$ word line WL07 and $n+1^{th}$ word line WL08 extend in opposite directions which allows for minimization of the spacing between these word lines. The remaining word lines WL (except for WL06 and WL09) can be closely spaced as well since the pad extension portions underlying adjacent contact patterns CT extend in a same direction within the first and second decoders DEC1 and DEC2. Further, while the pad extension portions of the word lines WL06 and WL09 extend towards each other, they are spaced apart with two intervening word lines WL07 and WL08, thus allowing for sufficient layout in the first decoder DEC1.

Still referring to FIG. 3, further minimization of the spacing between word lines WL can be achieved by laterally shifting (or offsetting) the positions of the contact patterns CT within the first and second decoders DEC and DEC2 by an offset interval I1. According to the example of FIG. 3, this is achieved in the first decoder DEC1 by sequentially decreasing the length the even numbered word lines among the word lines WL {0, 1, 2, . . . n}, and sequentially increasing the length of the odd numbered word lines among the word lines WL {n+1, . . . m−1, m}. In other words, even numbered word lines WL00-WL06 sequentially decrease in length, and odd numbered word lines WL09-WL15 sequentially increase in length. In the second decoder DEC2, offsetting of the contact patterns CT is achieved by sequentially increasing length of the odd numbered word lines among the word lines WL {0, 1, 2, . . . n}, and sequentially decreasing the length of the even numbered word lines among the word lines {n+1, . . . m−1, m}. In other words, even numbered word lines WL08-WL14 sequentially decrease in length, and odd numbered word lines WL01-WL07 sequentially increase in length. Also, in FIG. 3, the length of the $n^{th}$ word line (WL07) is the same as the length of the $n+1^{th}$ word line (WL08).

In the example give above, the word line layout with a memory array block is described. However, the invention is not limited in this respect, and instead the layout can be applied to other types of data lines such as bit lines.

FIGS. 4 through 7 are plan views for explaining a method of forming a data line layout of a semiconductor memory device according to a first embodiment of the present invention.

Figure 4:
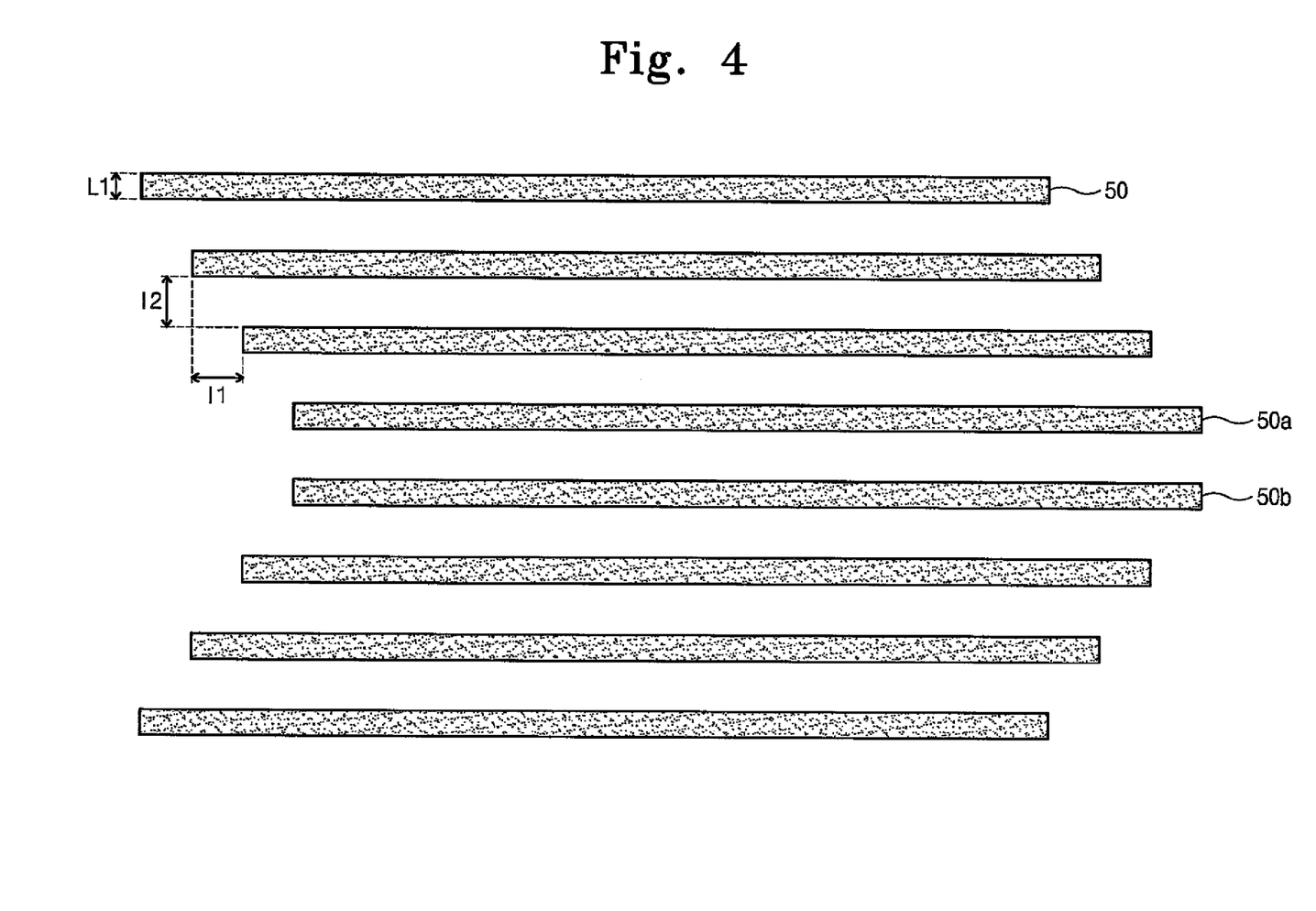
FIGS. 4 through 7 are plan views illustrating a method of forming a data line layout of a semiconductor memory device according to a first embodiment of the present invention.

Referring first to FIG. 4, a plurality of striped dummy patterns 50 is formed on a semiconductor substrate. The dummy patterns 50 each have a width L1 and are spaced apart from each other by a distance I2. In addition, the first through fourth dummy patterns (counting from the top of FIG. 4) are sequentially offset in one direction by a distance I1, while the fifth through eighth dummy patterns 50 are sequentially offset in an opposite direction by the distance I1. In addition, the fourth and fifth dummy patterns 50a and 50b are formed at the same lateral offset position as shown in FIG. 4.

Figure 5:
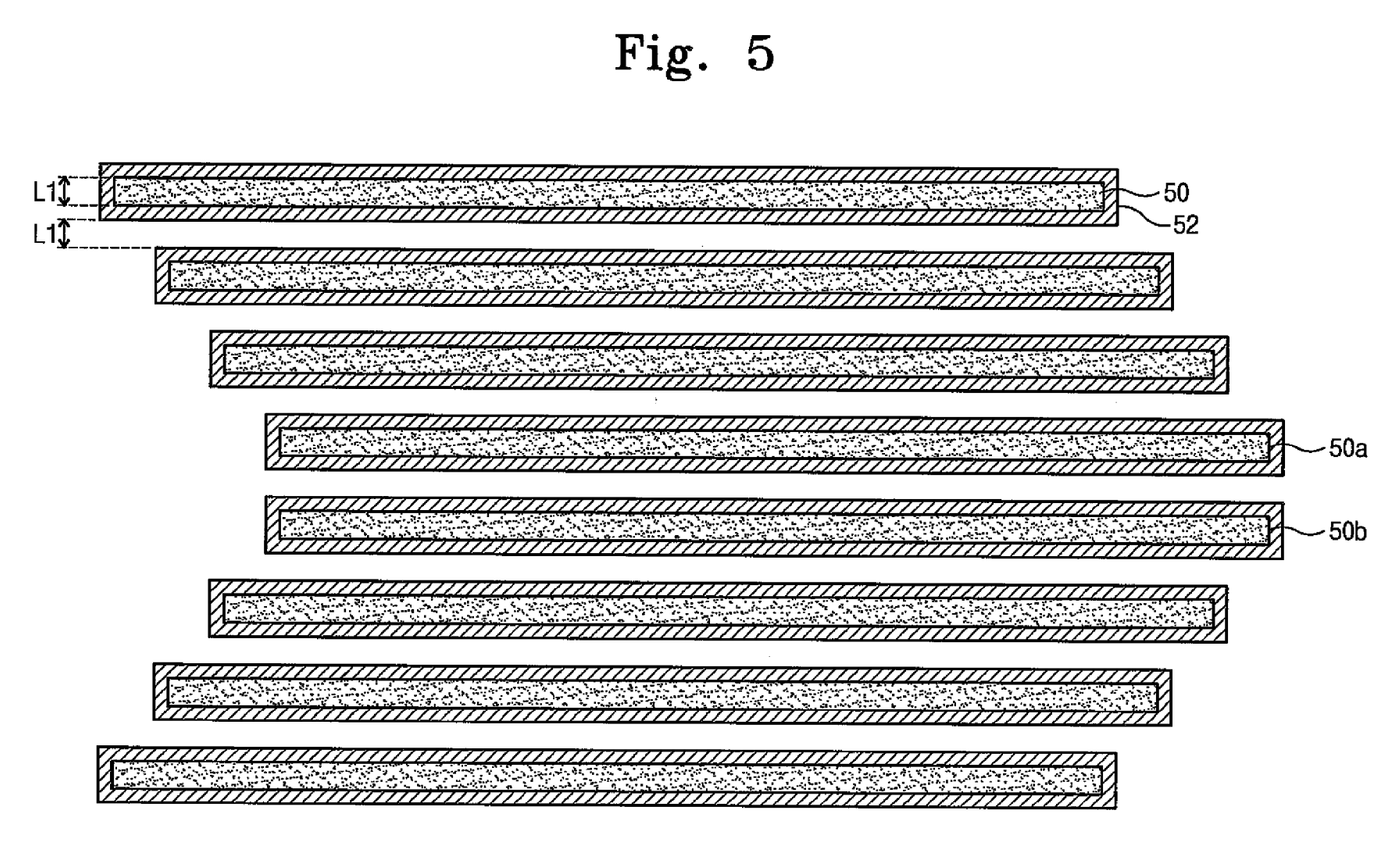

Referring to FIG. 5, spacer patterns 52 are formed on sidewalls of the dummy patterns 50. At this point, when the data lines are arranged in an equal distance, the width of the dummy pattern 50 and the width between the spacer patterns 52 can be equally arranged at L1. The spacer pattern 52 has a structure of the data line. When the spacer pattern 52 is used to form the word line, the spacer pattern 52 is a structure in which a conductive film is formed on the insulation film. Especially, when the semiconductor memory device is a non-volatile memory device (e.g. flash memory device), the spacer pattern includes a plurality of floating gates formed on the gate insulation film, a control gate electrode formed on the floating gate, and a gate-interlayer dielectric film interposed between the floating gate and the control gate electrode. The spacer pattern 52 can be used for the word lines and the bit lines.

Figure 6:
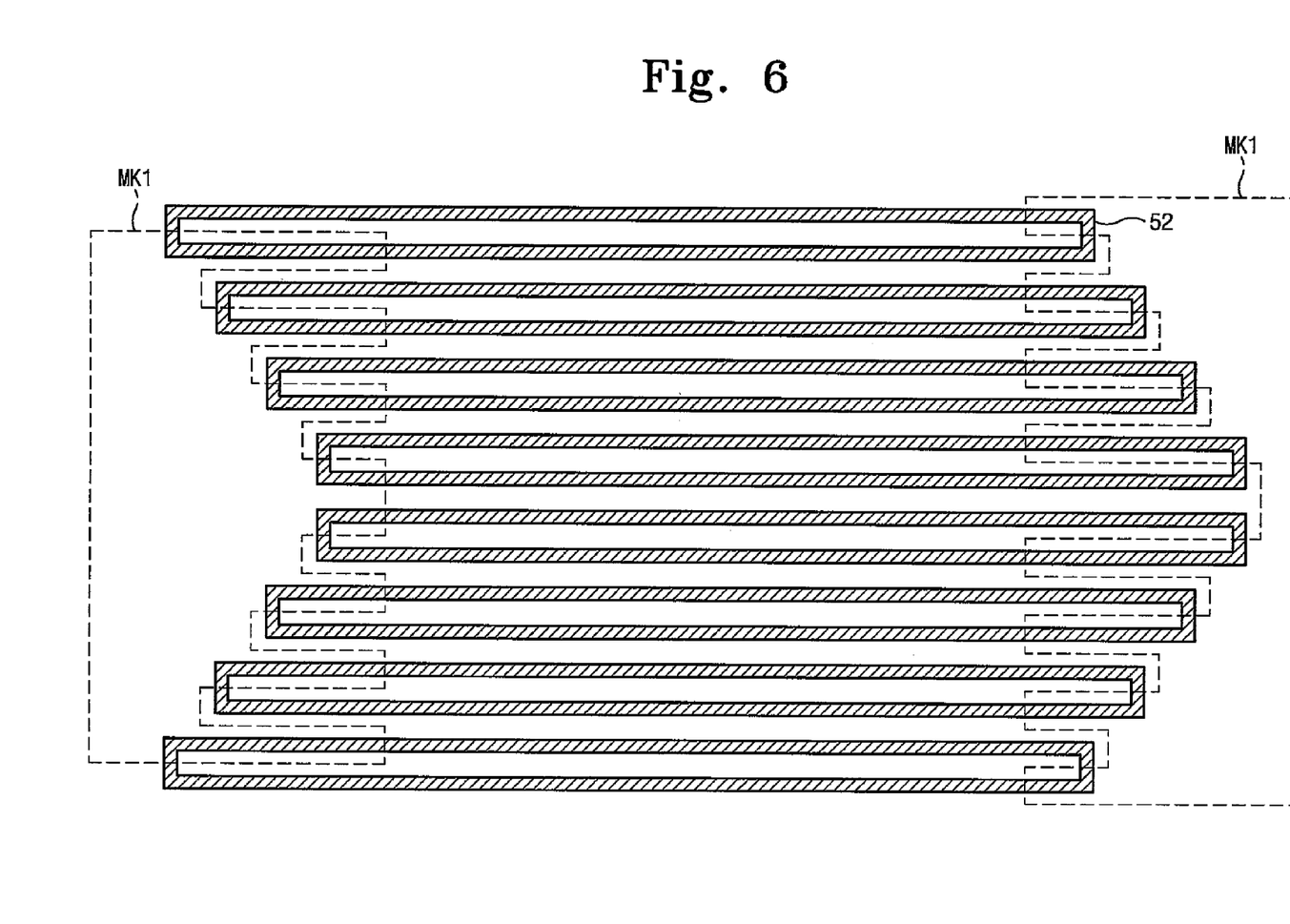

Referring to FIG. 6, the spacer pattern 52 in a loop shape remains after removing the dummy patterns 50. One spacer pattern 52 can be divided into two stripe patterns by removing two portions of the spacer pattern 52 in the loop shape. At this point, the spacer pattern 52 is removed using a mask MK1 to open an edge portion of the spacer pattern 52 facing diagonally, and then the two stripe patterns can be obtained. Additionally, the two stripe patterns can have a portion bent to an opposite direction each other in an end part.

Figure 7:
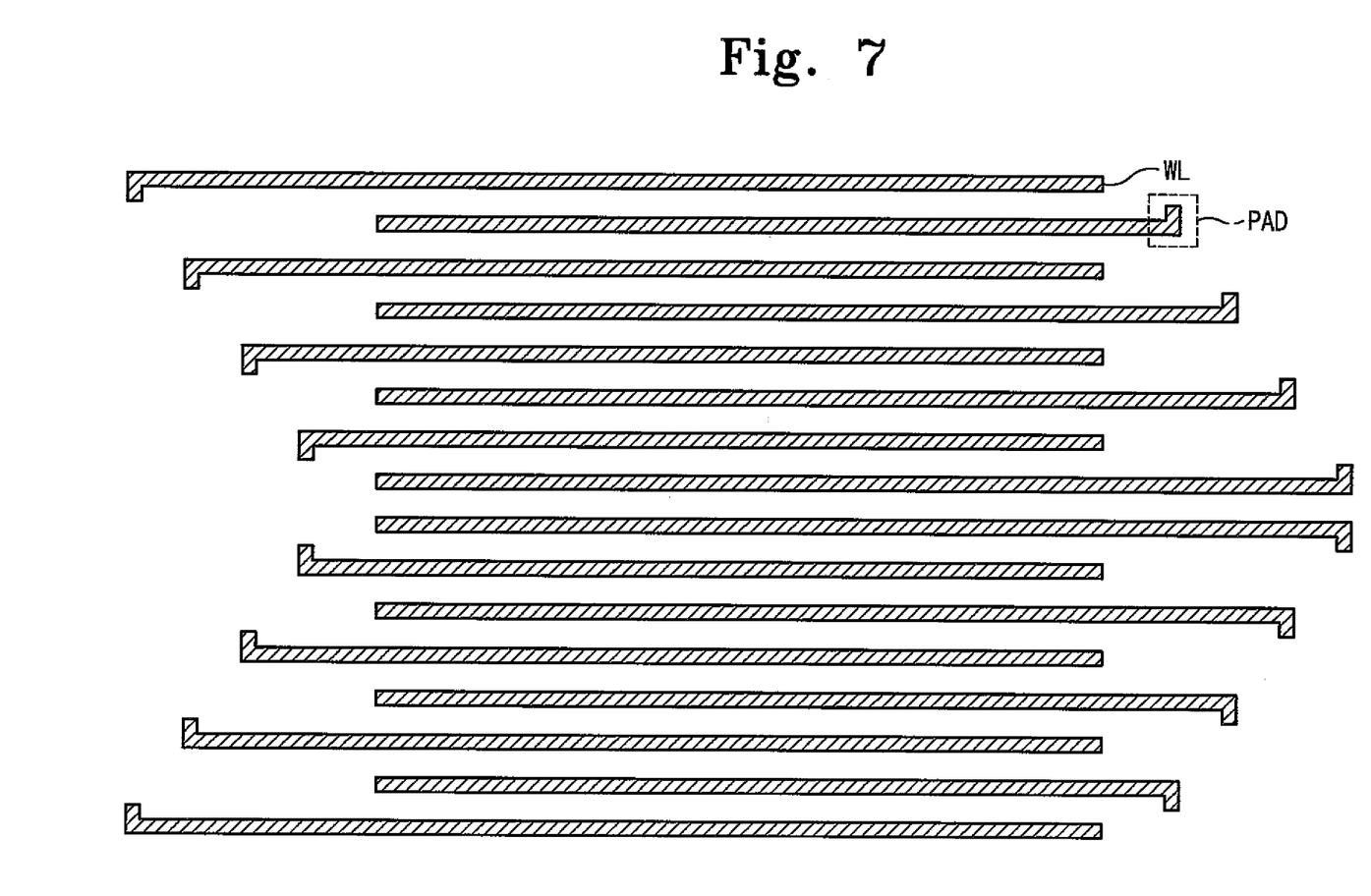

Referring to FIG. 7, a plurality of data lines (word line WL) in a stripe shape is formed by removing a portion of the spacer pattern 52. At this point, a pad extension portion PAD, where one end part of each word line WL is bent, is formed by appropriately selecting a portion that separates the spacer pattern 52. Next, a contact pattern is connected to the pad extension portion PAD and then an layout of the data line can be obtained as illustrated in FIG. 3.

As illustrated in FIG. 3, the pad extension portion PAD of the first embodiment can have width less than the limitation value of the photo-etching process. Accordingly, it is possible to have the small contact area of the contact pattern CT, which is defined by the photo-etching process, and the pad extension portion PAD. In the second embodiment of the present invention, there is provided a data line having a large contact region with a contact pattern CT defined by the photo-etching process and a method of forming the same.

Figure 8:
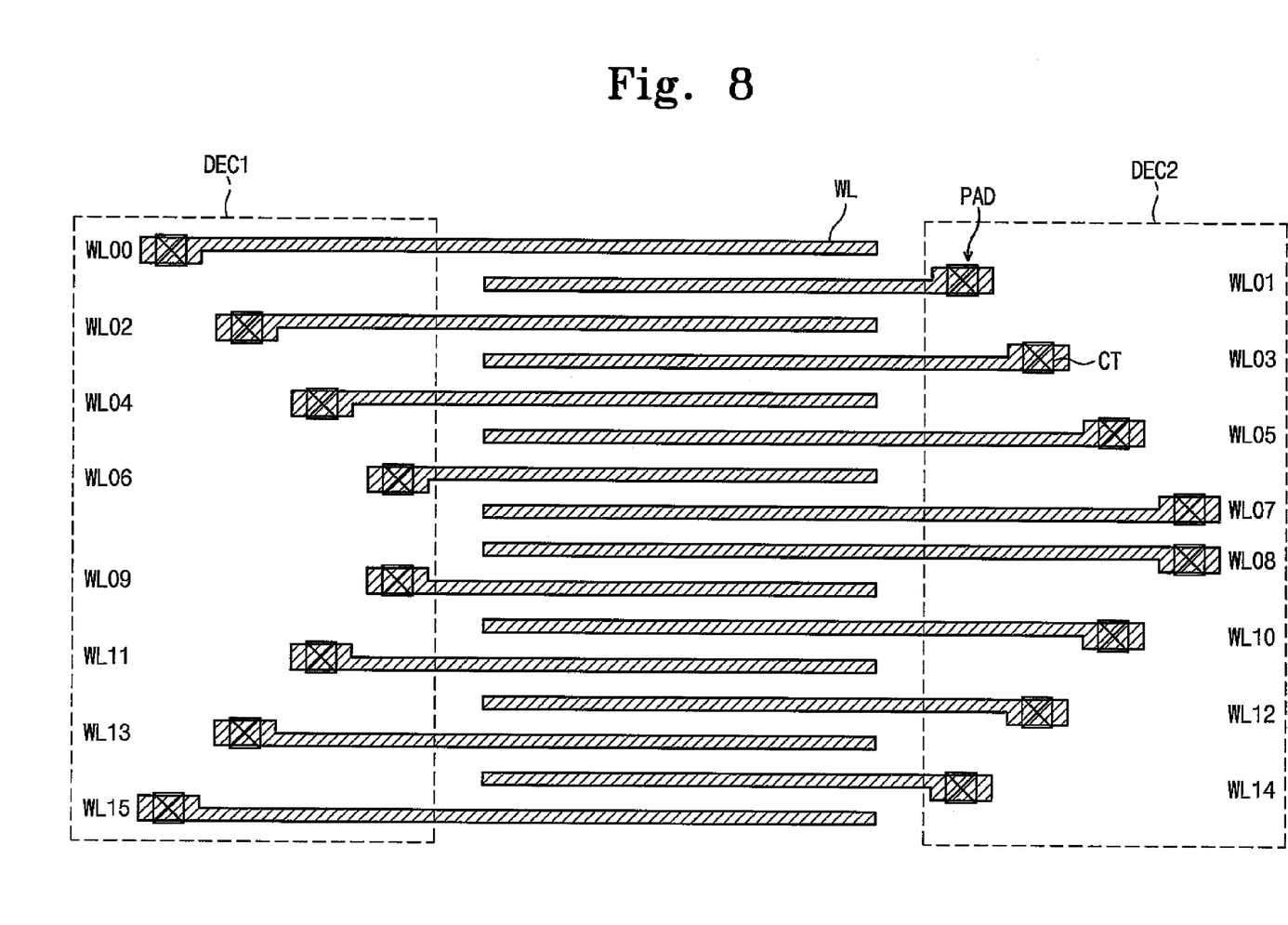
FIG. 8 is a plan view illustrating a data line layout of a semiconductor memory device according to a second embodiment of the present invention.

FIG. 8 is a plan view illustrating data line layout of a semiconductor memory device according to a second embodiment of the present invention.

Referring to FIG. 8, the second embodiment is similar to the first embodiment of FIG. 3, and accordingly a description of like elements of the two embodiments will not be repeated here to avoid redundancy in the description.

Unlike the first embodiment, the length (left-to-right in FIG. 8) of the pad extension portions PAD is broader than the width (up-and-down in FIG. 8) of the word line WL. For example, the length of each pad extension portion PAD may be two times or more the width of the word line WL. The contact pattern CT is connected to the pad extension portion PAD. Accordingly, the contact area of the pad extension portion PAD and the contact pattern CT is larger than that of the first embodiment.

FIGS. 9 through 12 are plan views illustrating a method of forming a data line layout of a semiconductor memory device according to a second embodiment of the present invention.

Figure 9:
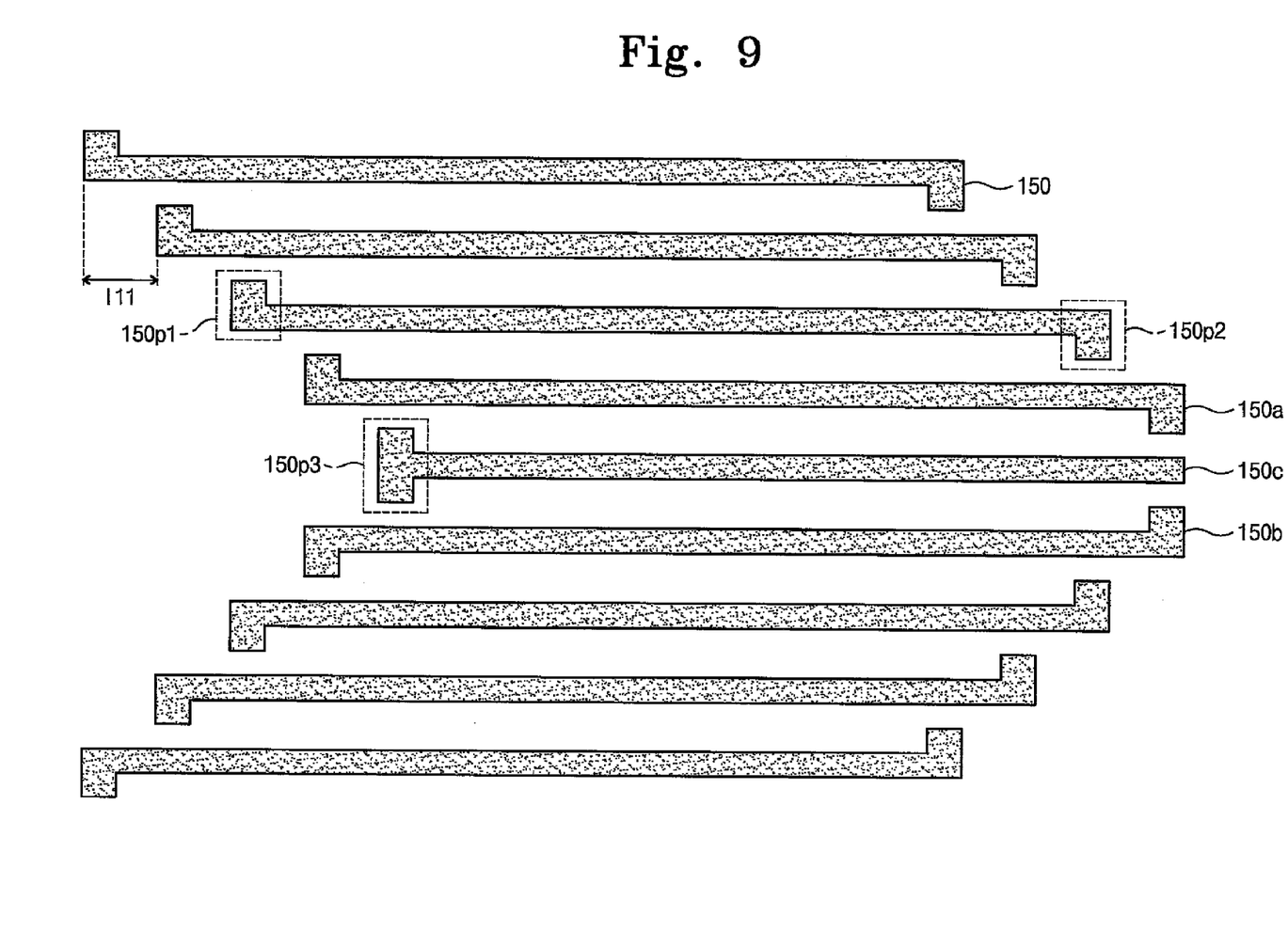
FIGS. 9 through 12 are plan views illustrating a method of forming a data line layout of a semiconductor memory device according to a second embodiment of the present invention.

Referring to FIG. 9, a plurality of dummy patterns 150 is formed on a semiconductor substrate to form the line width of the data line smaller than the limitation value of the photo-etching process. The dummy patterns 150 are parallel to each other in a stripe form. The dummy patterns 150 include the first dummy pattern group and the second dummy pattern group disposed symmetrically to each other. The first dummy pattern group includes first dummy patterns 150a and the second dummy pattern group includes the second dummy patterns 150b. The both end parts of each first dummy pattern 150a and each second dummy pattern 150b include portions 150p1 and 150p2 extended to an opposite direction, respectively. A third dummy pattern 150c is formed between the first dummy pattern group and the second dummy pattern group. The end part of the third dummy pattern 150c in the first decoder region includes a portion 150p3 extended to both directions. The end parts 150p2 of the first dummy pattern group and the second dummy pattern group in the second decoder region are extended to an oppositely extended direction of the end part 150p1 of the first dummy pattern group and the second dummy pattern group in the first decoder region. In this point, the dummy patterns can be arranged to be shifted by a predetermined distance in width and height so that the data lines can be arranged to be shifted in one direction. In this case, it is desirable that each end part of the extended portions 150p1, 150p2 and 150p3 of the dummy patterns faces a sidewall of an adjacent dummy pattern. It is desirable that the distance between the extended portion and the sidewall of the dummy pattern is smaller than two times of the width of the spacer pattern to be formed later. In this case, since s spacer pattern can be connected in a portion facing the end part of the extended part and the dummy pattern to each other, a pad extension portion with a broad width can be formed. The end parts of the first and second dummy pattern 150a and 150b adjacent to the third dummy pattern 150c and the third dummy pattern 150c are arranged on the same vertical side in the second decoder region. Moreover, the end parts of the first and second dummy pattern 150a and 150b adjacent to the third dummy pattern 150c are shifted to the left by a predetermined distance with respect to the third dummy pattern 150c in the first decoder region.

Figure 10:
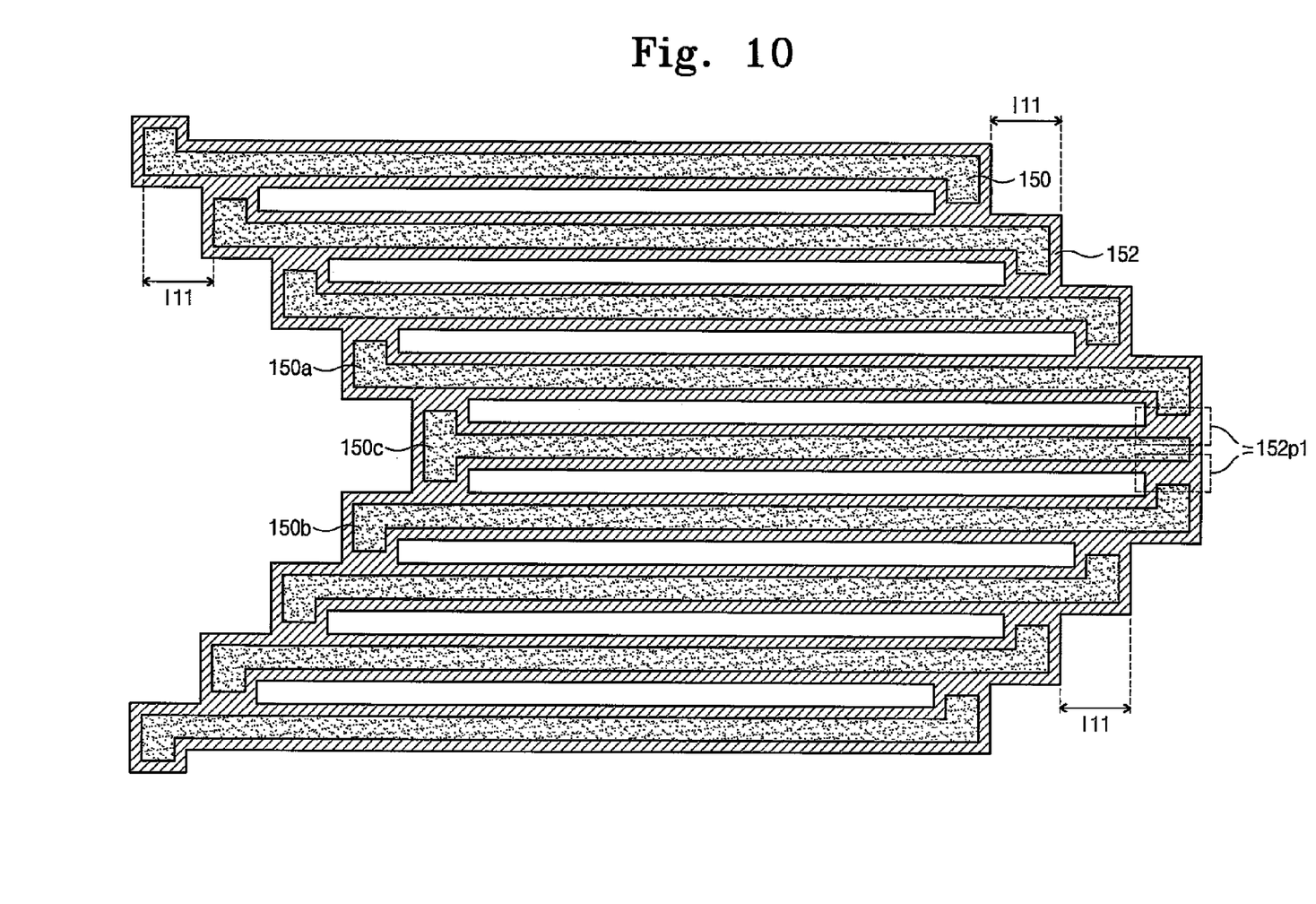

Referring to FIG. 10, a spacer pattern 152 is formed on a sidewall of the dummy pattern 150. In the second embodiment, the spacer pattern 152 includes a structure to be a data line later. Since the distance between the end part of the dummy pattern and the sidewall of the adjacent another dummy pattern is less than two times of the width of the spacer pattern 152, the end part of the dummy pattern is connected to the sidewall of the adjacent another dummy pattern in the spacer pattern 152. The spacer pattern 512 is shifted by a predetermined distance I11, and formed on the sidewall of the dummy pattern in a step shape.

Figure 11:
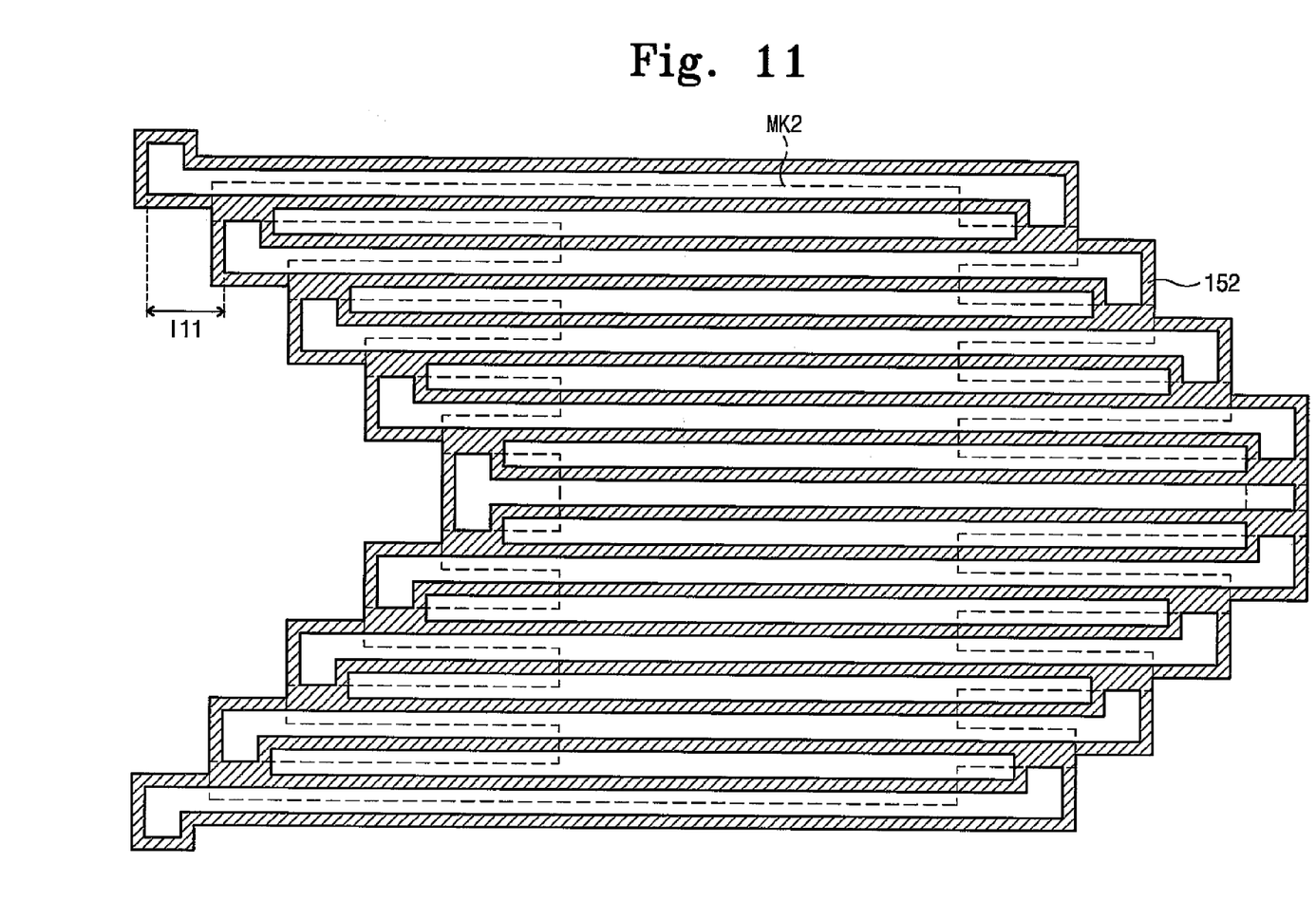

Referring to FIG. 11, the spacer pattern 152 with a plurality of stripe slits remains after removing the dummy patterns 150. The data line is formed by removing the spacer pattern using a mask MK2 to open a portion of the spacer pattern 152.

Figure 12:
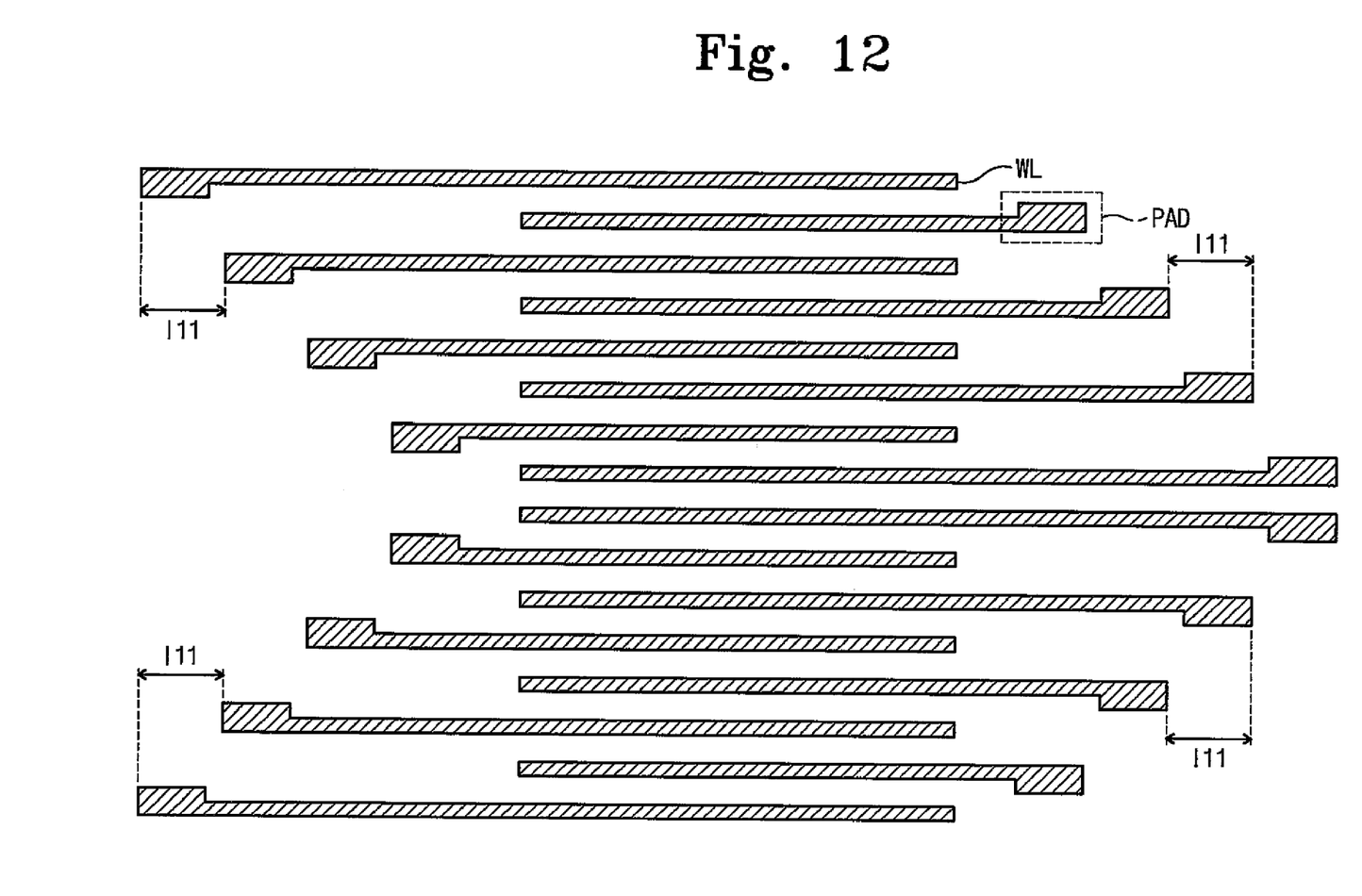

Referring to FIG. 12, the data lines (here, word line WL) in a plurality of stripe shape are formed by removing a portion of the spacer pattern 152. At this point, a pad extension portion PAD, where one end part of each word line WL is bent, is formed by appropriately selecting a portion that separates the spacer pattern 152. Since the width of the pad extension portion PAD is two times of the width of the spacer pattern, the contact area of the pad extension portion PAD and the contact pattern CT is broader than that of the first embodiment as illustrated in FIG. 8.

According to the present invention, the data line is extended to the first decoder region and the second decoder region disposed on both side of the data block, respectively. At this point, since the even-number before the predetermined ordinal number and the odd-number after the predetermined number are extended to the first decoder region or the second decoder region, the small width line of the data line can be achieved, and also the interval between the contact patterns can be obtained. Moreover, since end parts of the data lines disposed on the first decoder region and the second decoder region are shifted in one direction and then are shifted in another direction, the decoder region can be reduced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming data lines, comprising:

defining a data block on a semiconductor substrate and first and second decoder regions on opposite sides of the data block;

forming a plurality of parallel dummy patterns extended so as to cross over the data block from the first decoder region to the second decoder region; and forming spacer patterns surrounding sidewalls of the plurality of parallel dummy patterns; and separating each of the spacer patterns into two portions by patterning to define M parallel and sequentially arranged data lines numbered $\{0, 1, 2, \ldots n, n+1, \ldots, m-1, m\}$, where M, n and m are positive integers, and where n<m, and M=m+1, wherein a first data line group among the M parallel and sequentially arranged data lines extend to the first decoder region from the data block, wherein a second data line group among the M parallel and sequentially arranged data lines extend to the second decoder region from the data block, wherein the first data line group includes even numbered data lines among the data lines $\{0, 1, 2, \ldots n\}$, and odd numbered data lines among the data lines $\{n+1, \ldots m-1, m\}$, and wherein the second data line group includes odd numbered data lines among the data lines $\{0, 1, 2, \ldots n\}$, and even numbered data lines among the data lines $\{n+1, \ldots m-1, m\}$.

2. The method of claim 1, wherein each of the M parallel and sequentially arranged data lines extends in a first direction, and wherein an end of each of the M parallel and sequentially arranged data lines include a pad extension portion located in the first or second decoder region and extending an angle relative to the first direction.

3. The method of claim 1, wherein the parallel dummy patterns comprises a first dummy pattern group and a second dummy pattern group arranged symmetrically, and a third dummy pattern arranged between the first dummy pattern group and the second dummy pattern, the first dummy pattern group and the second dummy pattern group comprising dummy patterns having both end parts extended in a different direction to each other, an end part of the third dummy pattern in the first decoder region extended to both directions, and end parts of the first dummy pattern group and the second dummy pattern group in the second decoder region extended toward the third dummy pattern.

4. The method of claim 3, wherein the dummy patterns are shifted in one direction and arranged as the dummy patterns becomes far from the third dummy pattern with reference to the third dummy pattern.

5. The method of claim 3, wherein the extended end parts of the dummy patterns face sidewalls of an adjacent other dummy pattern.

6. The method of claim 3, wherein distance a between the extended end part of the dummy patterns and the adjacent dummy pattern is less than two times of the width of the spacer pattern.

7. The method of claim 1, wherein a minimum distance between adjacent dummy patterns is less than two times of the width of the spacer pattern, and a maximum distance between the adjacent dummy patterns is more than two times of the width of the spacer pattern.

* * * * *